United States Patent [19]
Kawasaki et al.

[11] Patent Number: 6,046,488
[45] Date of Patent: Apr. 4, 2000

[54] SEMICONDUCTOR DEVICE HAVING CONDUCTIVE LAYER AND MANUFACTURING METHOD THEREOF

[75] Inventors: Takahiro Kawasaki; Shigeru Harada; Hiroshi Tobimatsu, all of Hyogo, Japan

[73] Assignees: Mitsubishi Denki Kabushiki Kaisha, Tokyo; Ryoden Semiconductor System Engineering Corporation, Hyogo, both of Japan

[21] Appl. No.: 08/985,218

[22] Filed: Dec. 4, 1997

[30] Foreign Application Priority Data

Jun. 13, 1997 [JP] Japan .................................. 9-156724

[51] Int. Cl.[7] .................................................. H01L 29/00
[52] U.S. Cl. ......................... 257/529; 257/530; 257/209
[58] Field of Search ..................... 257/529, 758, 257/530, 760, 209; 438/281, 601, 637, 675

[56] References Cited

U.S. PATENT DOCUMENTS

| | | | |
|---|---|---|---|
| 4,853,758 | 8/1989 | Fischer | 357/51 |
| 5,235,205 | 8/1993 | Lippitt, III | 257/528 |
| 5,365,104 | 11/1994 | Godinho et al. | 257/529 |
| 5,454,904 | 10/1995 | Ghezzo et al. | 216/13 |
| 5,652,459 | 7/1997 | Chen | 257/529 |
| 5,747,868 | 5/1998 | Reddy et al. | 257/529 |
| 5,754,089 | 5/1998 | Chen | 257/529 |

FOREIGN PATENT DOCUMENTS

| | | |
|---|---|---|
| 58-77246 | 5/1983 | Japan . |
| 64-71147 | 3/1989 | Japan . |

*Primary Examiner*—Olik Chaudhuri
*Assistant Examiner*—Phat X. Cao
*Attorney, Agent, or Firm*—McDermott, Will & Emery

[57] ABSTRACT

A semiconductor device allowing the manufacturing process to be simplified and fine structures therein to be readily formed and a manufacturing method thereof are provided. In the semiconductor device, a conductive layer is used as a mask during etching for forming a first opening.

4 Claims, 12 Drawing Sheets

6,046,488

SEMICONDUCTOR DEVICE HAVING CONDUCTIVE LAYER AND MANUFACTURING METHOD THEREOF

BACKGROUND OF THE INVENTION

1. Field of the Invention

The present invention relates generally to semiconductor devices and manufacturing methods thereof, and more particularly, to a semiconductor device having a conductive layer and a manufacturing method thereof.

2. Description of the Background Art

There has been known a defect repairing method according to which a circuit hit by a defect and found through examination is switched to a previously provided redundancy circuit, in order to prevent the yield of semiconductor devices from degrading due to defects caused in the manufacturing process. According to the repairing method, during switching the defect-hit circuit with the redundancy circuit, an interconnection for switching (fuse) to the redundancy circuit is fused by laser beam irradiation (laser fusion). FIG. 16 is a cross sectional view showing a fuse portion and its vicinity in a semiconductor device including a fuse layer for achieving conventional laser fusion. Referring to FIG. 16, the conventional semiconductor device including the fuse layer includes a semiconductor substrate 101, a first interconnection layer 102 to be the fuse layer, first and second interlayer insulating films 103 and 105, second interconnection layers 104a and 104b, third interconnection layers 106a and 106b, a passivation film 107, a buffer coat film 108 and an opening 700.

First interconnection layer 102 to be the fuse layer is formed on the surface of semiconductor substrate 101. First interlayer insulating film 103 is formed covering first interconnection layer 102. Second interconnection layers 104a and 104b are formed on first interlayer insulating film 103. Second interlayer insulating film 105 is formed on first interlayer insulating film 103 and second interconnection layers 104a and 104b. Through holes 500 and 600 are formed in regions positioned above second interconnection layers 104a and 104b in second interlayer insulating film 105. In through holes 500 and 600, third interconnection layers 106a and 106b are formed in contact with second interconnection layers 104a and 104b and extending along second interlayer insulating film 105. Passivation film 107 is formed on third interconnection layers 106a and 106b and second interlayer insulating film 105. Buffer coat film 108 is formed on passivation film 107. Part of buffer coat film 108, passivation film 107, second interlayer insulating 105 and first interlayer insulating film 103 is removed to form opening 700 having a width L of about 10 μm.

During switching from the defect-hit circuit to the redundancy circuit, first interconnection layer 102 to be the fuse layer is fused by external laser irradiation. If first and second interlayer insulating films 103 and 105 and the other layers on first interconnection layer 102 have a great thickness, the irradiated laser beam sometimes could not reach and fuse first interconnection layer 102. Thus, opening 700 is formed to entirely remove second interlayer insulating film 105 positioned on the portion of first interconnection layer 102 to be fused and first interlayer insulating film 103 should be reduced in the thickness.

FIGS. 17 to 22 are cross sectional views for use in illustration of the process of manufacturing the conventional semiconductor device including a fuse layer shown in FIG. 16.

Referring to FIGS. 17 to 22, the process of manufacturing the conventional semiconductor device including the fuse layer shown in FIG. 16 will be described.

Referring to FIG. 17, first interconnection layer 102 to be a fuse layer is formed on the surface of semiconductor substrate 101. First interlayer insulating film 103 is formed covering first interconnection layer 102. Second interconnection layers 104a and 104b are formed on first interlayer insulating film 103. Second interlayer insulating film 105 is formed on second interconnection layers 104a and 104b and first interlayer insulating film 103. A resist pattern (not shown) is formed on second interlayer insulating film 105. Using the resist pattern as a mask, second interlayer insulating film 105 is partly etched away and though holes 500 and 600 are formed, followed by removal of the resist. Third interconnection layers 106a and 106b are formed in through holes 500 and 600 in contact with second interconnection layers 104a and 104b and extending along the upper surface of second interlayer insulating film 105. A resist pattern 111 is provided on third interconnection layers 106a and 106b and second interlayer insulating film 105.

Using resist pattern 111 as a mask, first and second interlayer insulating films 103 and 105 are partly anisotropically etched away, and an opening 300 as shown in FIG. 18 is formed, followed by removal of resist pattern 111 (see FIG. 17).

Then, as shown in FIG. 19, passivation film 107 is formed on second interconnection layers 106a and 106b, second interlayer insulating film 105, and in opening 300. Resist pattern 112 is formed on passivation film 107.

Then, using resist pattern 112 as a mask, passivation film 107 positioned in opening 300 is anisotropically etched away. Thereafter, resist pattern 112 is removed to provide a structure as shown in FIG. 20.

Then, as shown in FIG. 21, buffer coat film 108 formed of photosensitive polyimide resin is formed on passivation film 107 and in opening 300. Buffer coat film 108 is heat-treated as will be described, and has its thickness reduced as it changes into its final state by the heat treatment. Thus, buffer coat film 108 must have a thickness in the range from 10 μm to 20 μm in order to secure a desired thickness after the heat treatment.

As shown in FIG. 22, buffer coat film 108 is exposed to light through a mask pattern, developed, and removed of its part positioned on opening 300 (see FIG. 18). Opening 700 is formed as a result.

Then, buffer coat film 108 has its state changed into its final state by heat treatment and a structure as shown in FIG. 16 results.

The conventional semiconductor device including a fuse layer has been manufactured in the above-described manner. In the process of manufacturing the conventional semiconductor device shown in FIGS. 17 to 22, however, first and second interlayer insulating films 103 and 105, passivation film 107, and buffer coat film 108 all should be patterned to obtain a prescribed structure. This increases the number of manufacturing steps involved, resulting in increase in the manufacturing cost.

In order to solve such a disadvantage, a conventional manufacturing process as shown in FIGS. 23 to 25 has been proposed.

Referring to FIGS. 23 to 25, this conventional process of manufacturing a semiconductor device including a fuse layer will be described. Up to the step of forming opening 300 (see FIG. 18), the process is the same as the conventional manufacturing process described in conjunction with FIGS. 17 and 18. As shown in FIG. 23, passivation film 107 is formed on third interconnection layers 106a and 106b, and second interlayer insulating film 105, and in opening 300.

Buffer coat film 108 of photosensitive polyimide resin is formed on passivation film 107 in a thickness about in the range from 10 μm to 20 μm.

As shown in FIG. 24, buffer coat film 108 is exposed to light though a mask pattern, followed by development to remove buffer coat film 108 positioned in the region on opening 300.

Then, using buffer coat film 108 as a mask, passivation film 107 positioned in opening 300 (see FIG. 24) is anisotropically etched away, and opening 700 shown in FIG. 25 results. Herein, the proposed process of manufacturing the semiconductor device including a fuse layer employs buffer coat film 108 as a mask in the anisotropic etching for removing passivation film 107 positioned in opening 300, and therefore, the formation/removal of a mask pattern for the anisotropic etching is not necessary. As a result, the number of patterning can be reduced as compared to the manufacturing process described in conjunction with FIGS. 17 to 22, thereby simplifying the manufacturing process.

Thereafter, buffer coat film 108 is heat-treated and has its state changed into its final state, and the structure as shown in FIG. 16 results.

In the conventional manufacturing process as described in conjunction with FIGS. 23 to 25, buffer coat film 108 is used as a mask in the anisotropic etching for removing passivation film 107 positioned inside opening 300 (see FIG. 24). Buffer coat film 108, however, should be formed to have a thickness about in the range from 10 μm to 20 μm as described above. Opening 700 on first interconnection layer 102 to be a fuse layer (see FIG. 16) has width L of about 10 μm as described above. During processing buffer coat film 108 as shown in FIG. 24 in connection with such a fine structure as opening 700, the large thickness of buffer coat film 108 causes the aspect ratio to be increased, and causes incomplete formation of the pattern as shown in FIG. 26, or the size of a resulting pattern varies. Herein, the aspect ratio is the ratio of the width and depth of an opening, and for the same width, the value increases as the depth increases. FIG. 26 is a cross sectional view showing an incomplete pattern of buffer coat film 108 formed in the manufacturing process shown in FIG. 24. The disadvantage has impeded practical applications of the conventional proposed manufacturing process as shown in FIGS. 23 to 25.

SUMMARY OF THE INVENTION

It is an object of the invention to provide a semiconductor device in which its fine structures can be readily formed by a simplified manufacturing process.

Another object of the invention is to provide a method of manufacturing a semiconductor device according to which fine structures included therein can be readily formed by a simplified manufacturing process.

According to one aspect of the invention, a semiconductor device includes a first conductive layer, at least one insulating layer, a second conductive layer, and a first opening. The insulating layer is formed covering the first conductive layer. The second conductive layer is formed on the insulating layer. The first opening is formed on the first conductive layer with a part of the insulating layer interposed therebetween. A side surface of the first opening includes a side surface of the second conductive layer and a side surface of the insulating layer. According to this aspect, the side surface of the first opening is formed to include the side surfaces of the second conductive layer and the insulating layer, and therefore the second conductive layer can be used as a mask during etching for forming the first opening. Thus, patterned resist only for etching to form the first opening is not necessary, and the number of steps included in the manufacture can be reduced as a result. The first opening is formed using the second conductive layer as a mask, and therefore a protection film such as a thick buffer coat film or the like to use as a mask for forming the first opening is not necessary. Therefore, the fine first opening can be readily formed.

According to the aspect, a semiconductor device may additionally include a first protection film, a second protection film, and a second opening. The first protection film is formed on the second conductive layer, and the second protection film is formed on the first protection film. The second opening may be formed in the region positioned on the first opening. The second opening may be formed to have a width equal to or larger than the width of the first opening. A side surface of the second opening may be formed to include side surfaces of the first and second protection films. Thus, the side surface of the second opening is formed to include the side surfaces of the first and second protection films, the second protection film may be used as a mask during etching the first protection film for forming the second opening. Thus, patterned resist used only for etching to remove part of the first protection film to form the second opening is not necessary. As a result, the number of steps included in the manufacture can be reduced.

The second protection film is used as a mask for etching the first protection film, the second conductive layer is used as a mask for etching to form the first opening, and therefore the first and second openings can be serially formed by a single etching process. As a result, the number of steps can be reduced. Furthermore, since the width of the first opening is determined by the pattern of the second conductive layer, the width of second opening can be made larger than the width of the first opening. Thus, in a manufacturing process which will be described, the diameter of the second opening can be made large enough to reduce the aspect ratio. As a result, during forming the first and second openings, incomplete patterns can be advantageously prevented, and fine structures can be readily formed.

In the semiconductor device according to the aspect, the first conductive layer may be a fuse layer. The width of the first opening positioned in the region above the fuse layer is about 10 μm, which particularly requires fine processing among other structures in the semiconductor device. Therefore, in the processing steps, the disadvantages such as formation of incomplete patterns have been encountered. This is where the present invention is particularly effective, because the number of steps included in the manufacture can be reduced and fine structures can be readily formed according to the invention.

In the semiconductor device according to the aspect, the second conductive layer may be a guard ring. Herein, the guard ring is a conductor to trap contaminant such as sodium ions in the region in which the protection film is not thick enough to protect semiconductor elements such as in an opening, and to prevent impurities from coming into the semiconductor element region. Since the second conductive layer is formed as a guard ring, at the first and the second openings, impurities can be prevented from coming into the semiconductor element region. As a result, operation faults in the semiconductor device can be advantageously prevented.

In a method of manufacturing a semiconductor device according to another aspect of the invention, a first conductive layer is formed, and then at least one insulating layer is formed thereon. A second conductive layer is formed on the insulating layer. Part of the insulating layer is etched away using the second conductive layer as a mask, and a first opening is formed. The first opening is formed in a region on the first conductive layer with the insulating layer and part of other elements interposed therebetween. A side surface of the first opening includes side surfaces of the second conductive layer and the insulating layer. Thus, the second conductive layer is used as a mask during etching for forming the first opening. Therefore, patterned resist particularly for forming the first opening is not necessary. The number of steps included in the manufacture can be reduced as result. In addition, since the first opening is formed using the second conductive layer as a mask, a protection film such as a thick buffer coat film does not have to be used as a mask for forming the first opening. Therefore, the fine first opening can be readily formed.

In the manufacturing method according to the above aspect, the first protection film may be formed on the second conductive layer, and the second protection film may be formed on the first protection film. Using the second protection film as a mask, the first protection film present in the region positioned above the second conductive layer is etched away to form the second opening. The second opening may be formed to have a diameter equal to or larger than the diameter of the first opening, and the first and second openings may be serially formed.

Thus, the second protection film is used as a mask during etching the first protection film. Therefore, patterned resist particularly used for etching away part of the first protection film is not necessary. As a result, the number of steps included can be reduced. The second protection film is used as a mask for etching the first protection film, the second conductive layer is used as a mask for etching to form the first opening, and therefore the first and second openings can be serially formed by a single etching process. As a result, the number of steps included in the manufacture can be further reduced. Since the width of the first opening is determined by the pattern of the second conductive layer, the width of the second opening can be made larger than the width of the first opening. The width of the second opening can be made large enough to sufficiently reduce the aspect ratio. As a result, in the steps of forming the first and second openings, formation of incomplete patterns can be advantageously prevented, and fine structures can be readily formed.

In the manufacturing method according to the above aspect, after the first opening is formed, the first protection film may be formed on the second conductive layer and in the first opening, and the second protection film may be formed on the first protection film. Using the second protection film as a mask, the first protection film positioned on the second conductive layer may be partly etched away to form the second opening. Using the second conductive layer as a mask, the first protection film positioned in the first opening may be etched away. Herein, the step of forming the second opening and the step of removing the first protection film positioned in the first opening may be serially performed.

Thus, the formation of the second opening and the removal of the first protection film positioned in the first opening are serially performed by a single etching process, and therefore the number of steps included in the manufacture can be reduced. In addition, the second conductive layer is used as a mask for etching to remove the first protection film positioned in the first opening, the width of the second opening will not affect the step of removing the first protection film in the first opening. The width of the second opening therefore can be made larger than the width of the first opening. Thus, the width of the second opening can be made large enough to sufficiently reduce the aspect ratio. As a result, in the step of removing the first protection film positioned in the first opening, the disadvantage such as incomplete removal of the first protection film can be prevented, and fine structures can be readily formed.

In the manufacturing method according to the above aspect, the first conductive layer may be a fuse layer. The width of the first opening positioned in a region on the fuse layer is usually about 10 $\mu$m, which requires particularly fine processing among other structures in the semiconductor device. Therefore, in the processing steps, formation of incomplete patterns or etching residue have been encountered. This is where the present invention is particularly effective, because the manufacturing process can be simplified and fine structures can be readily formed according to the present invention.

In the manufacturing method according to the above aspect, the second conductive layer may be a guard ring. Since the second conductive layer is formed as a guard ring, impurities can be prevented from coming into the semiconductor element region at the first and second openings. As a result, operation faults in the semiconductor device can be advantageously prevented.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Now, preferred embodiments of the present invention will be described in conjunction with the accompanying drawings.

First Embodiment

Figure 1:
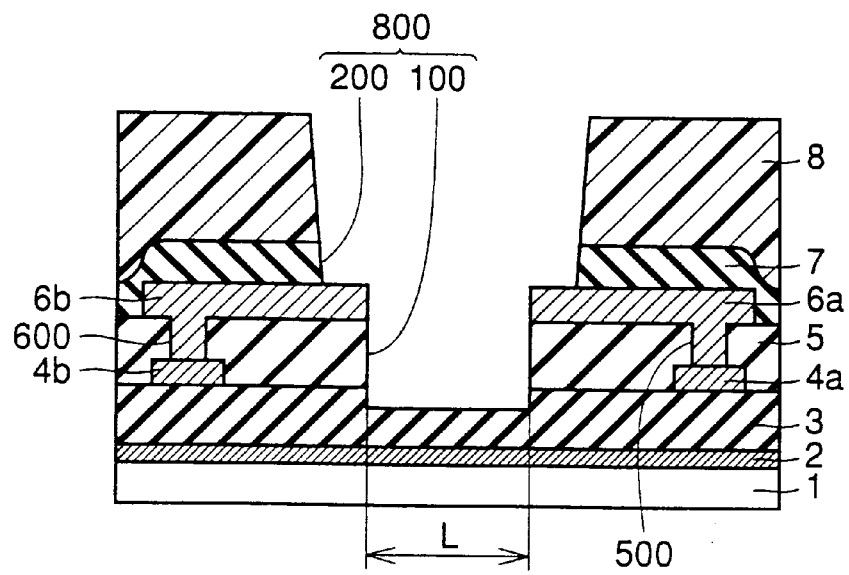
FIG. 1 is a cross sectional view showing a semiconductor device including a fuse layer according to a first embodiment of the invention.

Referring to FIG. 1, a semiconductor device including a fuse layer according to a first embodiment of the invention includes a semiconductor substrate 1, a first interconnection layer 2 to be a fuse layer, first and second interlayer insulating films 3 and 5, second interconnection layers 4a and 4b, third interconnection layers 6a and 6b, a passivation film 7, a buffer coat film 8, and a third opening 800 formed of first and second openings 100 and 200.

First interconnection layer 2 is formed on semiconductor substrate 1. First interlayer insulating film 3 is formed on first interconnection layer 2. Second interconnection layers 4a and 4b are formed on first interlayer insulating film 3. Second interlayer insulating film 5 is formed on first interlayer insulating film 3 and second interconnection layers 4a and 4b. In the region of second interlayer insulating film 5 positioned on second interconnection layers 4a and 4b, through holes 500 and 600 are formed. Third interconnection layers 6a and 6b are formed on second interlayer insulating film 5 and in through holes 500 and 600 in contact with second interconnection layers 4a and 4b. Passivation film 7 is formed on third interconnection layers 6a and 6b and second interlayer insulating 5. Buffer coat film 8 is formed on passivation film 7. First opening 100 is formed in a prescribed region on first interconnection layer 2. Second opening 200 is formed above first opening 100. First and second openings 100 and 200 define third opening 800 which extends from the surface of buffer coat film 8 down to first interlayer insulating film 3. A side surface of first opening 100 includes side surfaces of third interconnection layers 6a and 6b, first interlayer insulating film 3, and second interlayer insulating film 5. A side surface of second opening 200 includes side surfaces of passivation film 7 and buffer coat film 8.

Thus, the side surface of first opening 100 is formed to include the side surfaces of second interconnection layers 6a and 6b and first and second interlayer insulating films 3 and 5, third interconnection layer 6a and 6b may be used as masks during etching for forming first opening 100 as will be described. Thus, patterned resist used only for etching to form the first opening 100 is not necessary, which reduces to number of steps included in the manufacture. The side surface of second opening 200 includes the side surfaces of passivation film 7 and buffer coat film 8 and therefore buffer coat film 8 may be used as a mask during etching passivation film 7 in order to form second opening 200 in the manufacturing process which will be described. Therefore, patterned resist used only for etching away part of passivation film 7 and forming second opening 200 is not necessary, which reduces the number of steps included in the manufacture. Buffer coat film 8 is used as a mask for etching passivation film 7, third interconnection layers 6a and 6b are used as masks for etching for forming first opening 100, and therefore the first and second openings 100 and 200 can be serially formed by a single etching process, which further reduces the number of steps included in the manufacture.

Figure 10:
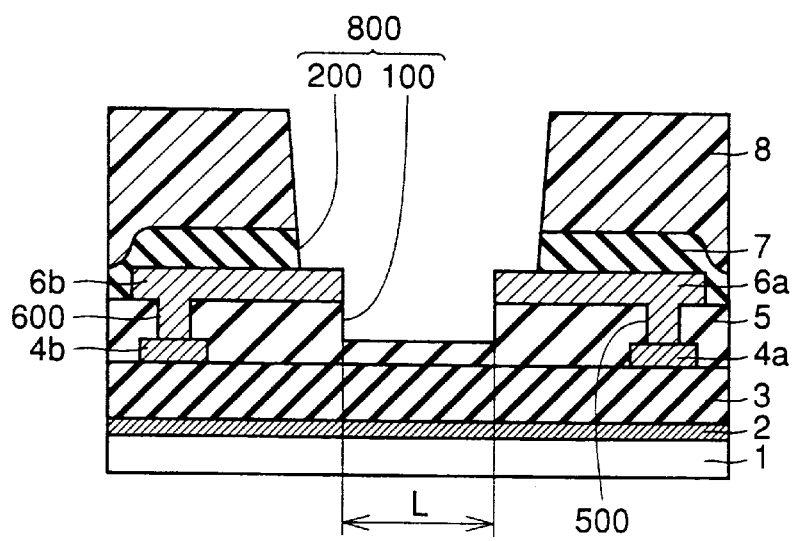
FIG. 10 is a cross sectional view showing a variation of the semiconductor device including the fuse layer according to the first embodiment shown in FIG. 1.

Furthermore, since the width L of first opening 100 is determined by the patters of third interconnection layers 6a and 6b, the width of second opening 200 may be made larger than the width of opening 100. As a result, in the manufacturing process which will be described, the width of second opening 200 may be made large enough to sufficiently reduce the aspect ratio. As a result, in the steps of forming first and second openings 100 and 200, incomplete formation of patterns can be advantageously prevented and fine structures can be readily formed. It is noted that as shown in FIG. 10, the same effect can be brought about if the side surface of first opening 100 is formed to include side surfaces of third interconnection layers 6a and 6b and a side surface of second interlayer insulating film 5. Herein, FIG. 10 is a cross sectional view showing a variation of the semiconductor device including the fuse layer according to the first embodiment of the invention, and has a structure substantially identical to the semiconductor device according to the first embodiment as shown in FIG. 1 except for first opening 100.

Referring to FIGS. 2 to 7, a process of manufacturing the semiconductor device including the fuse layer according to the first embodiment of the invention will be described.

Figure 2:
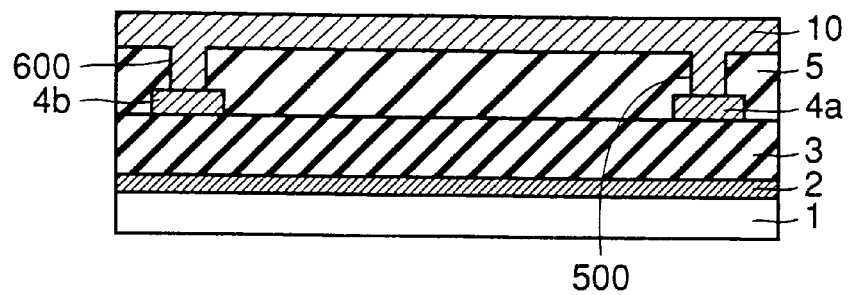
FIGS. 2 to 7 are cross sectional views showing first to sixth steps in the manufacturing process of the semiconductor device including the fuse layer according to the first embodiment.

As shown in FIG. 2, first interconnection layer 2 to be a fuse layer is formed on semiconductor substrate 1. First interlayer insulating film 3 is formed on first interconnection layer 2. Second interconnection layers 4a and 4b are formed on first interlayer insulating film 3. Second interlayer insulating film 5 is formed on second interconnection layers 4a and 4b and first interlayer insulating film 3. In regions of second interlayer insulation film 5 positioned on second interconnection layers 4a and 4b, through holes 500 and 600 are formed. In through holes 500 and 600, a metal layer 10 is formed in contact with second interconnection layers 4a and 4b. The material of metal layer 10 can be aluminum, an aluminum alloy, tungsten or the like.

Figure 3:
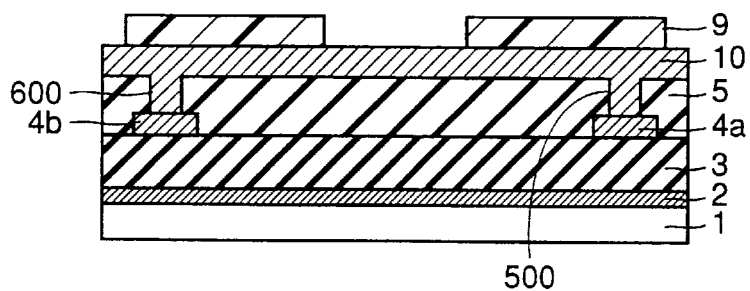

As shown in FIG. 3, patterned resist 9 is formed on metal layer 10. At the time, patterned resist 9 is formed in a step which will be described such that third interconnection layers 6a and 6b (see FIG. 1) can be used as masks during anisotropic etching for forming first opening 100 (see FIG. 1).

Figure 4:
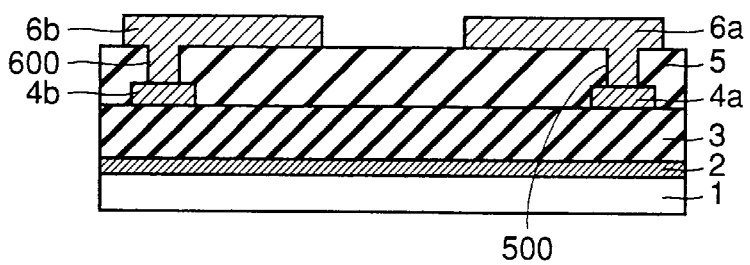

Then, using patterned resist 9 as a mask, metal layer 10 is partly anisotropically etched away, and third interconnection layers 6a and 6b (see FIG. 1) are formed, followed by removal of patterned resist 9. Thus, the structure as shown in FIG. 4 results.

Figure 5:
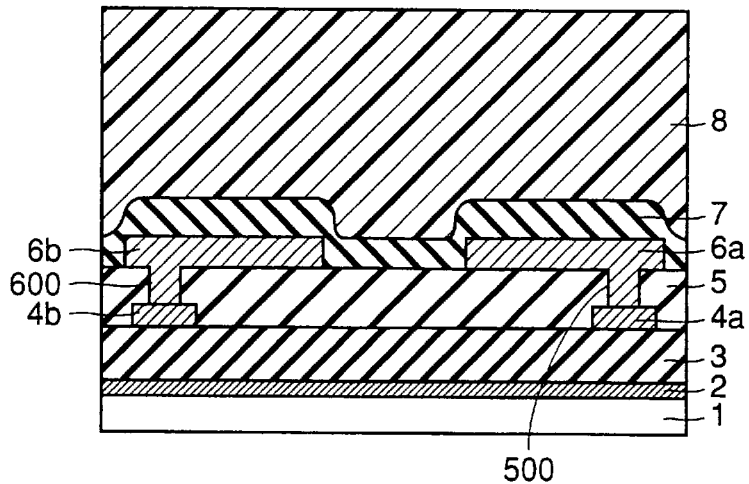

As shown in FIG. 5, passivation film 7 formed of a silicon oxide film is formed on third interconnection layers 6a and 6b and second interlayer insulating film 5. Passivation film 7 may be a silicon nitride film. Buffer coat film 8 of photosensitive polyimide resin having a thickness about in the range from 10 μm to 20 μm is formed on passivation film 7. Buffer coat film 8 may be of other photosensitive resin or silicon-based resin.

Figure 6:
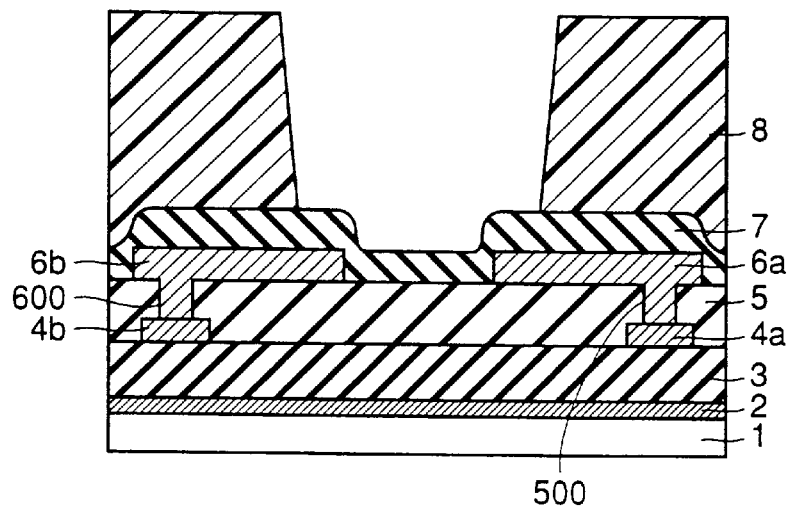

As shown in FIG. 6, buffer coat 8 is exposed to light through a mask pattern, and developed to remove buffer coat film 8 positioned in the region on first opening 100 (see FIG. 1).

Figure 7:
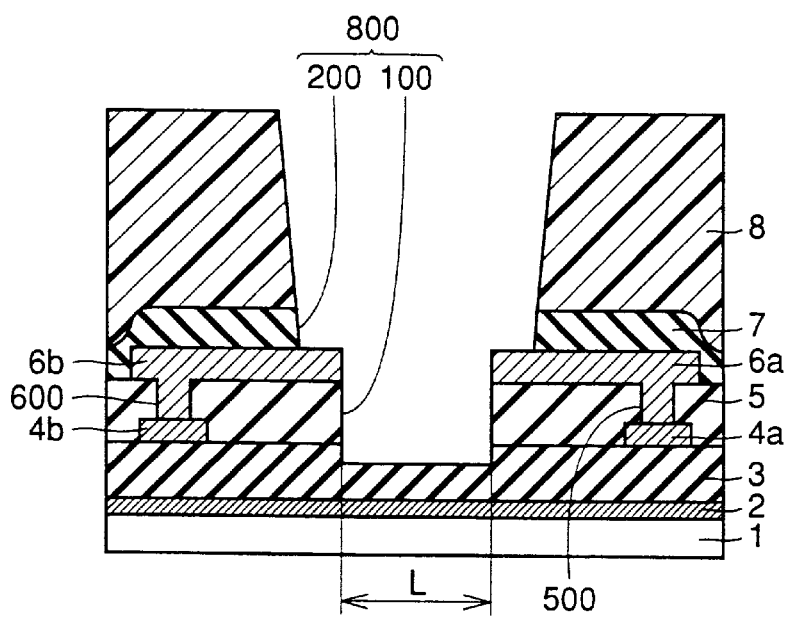

Now, using buffer coat film 8 as a mask for passivation film 7 and third interconnection layers 6a and 6b as masks for first and second interlayer insulating films 3 and 5, anisotropic etching is performed. Thus, third opening 800 defined by first and second openings 100 and 200 is formed as shown in FIG. 7 by the single anisotropic etching process. A gas used in the anisotropic etching can be $CHF_3$, $CF_4$, Ar, $O_2$ or the like. Herein, since third interconnection layers 6a and 6b are used as masks for forming first opening 100, patterned resist particularly used for first opening 100 is not necessary. Furthermore, buffer coat film 8 is used as a mask for partly removing passivation film 7 for forming second opening 200, patterned resist particularly for the purpose is not necessary. Buffer coat film 8 and third interconnection layers 6a and 6b are used as masks, first and second openings 100 and 200 can be formed by the single anisotropic etching process. As a result, the number of steps included in the manufacture can be reduced. In addition, third interconnection layers 6a and 6b are used as masks for forming first opening 100, the width of second opening 200 can be made large independently of the width L of first opening 100. As a result, the aspect ratio of third opening 800 can be reduced.

Then, buffer coat film 8 is heat-treated and has its state changed into its final state, and the structure as shown in FIG. 1 results. Herein, during the heat treatment, impurities such as fluorine which have come into buffer coat film 8 during the above anisotropic etching process can be let out form buffer coat film 8. The degradation of the performance of the semiconductor device due to such impurities can be advantageously prevented. Thus, the semiconductor device including the fuse layer according to the first embodiment of the invention is manufactured.

It is noted that if second interconnection layers 4a and 4b and third interconnection layers 6a and 6b are formed as guard rings of aluminum, for example, impurities such as sodium ions and potassium ions can be prevented from coming into the device at third opening 800. The material of the guard ring may be an aluminum alloy, tungsten or the like.

Figure 8:
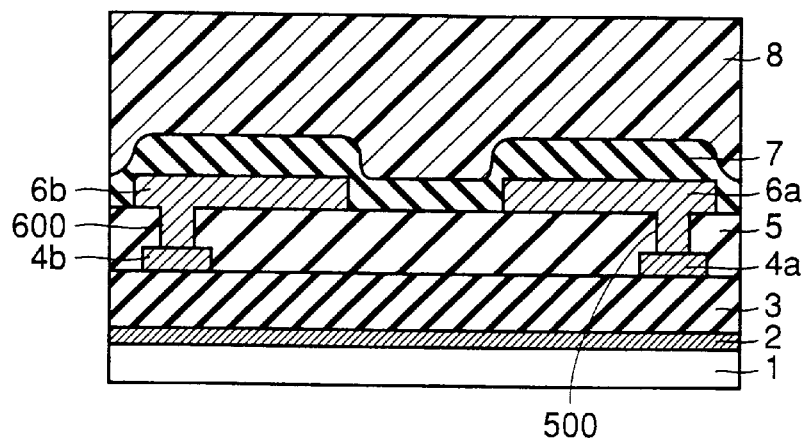
FIGS. 8 and 9 are cross sectional views for use in illustration of first and second steps in a variation of the manufacturing process of the semiconductor device including the fuse layer according to the first embodiment shown in FIG. 1.
Figure 9:
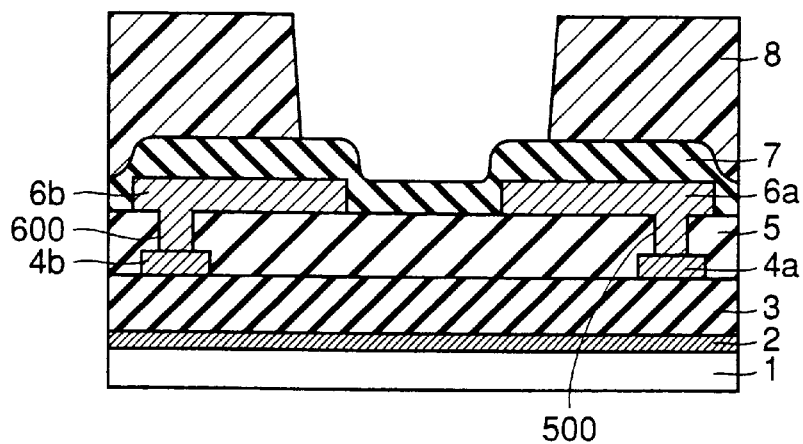

Another variation of the manufacturing process of the semiconductor device including the fuse layer according to the first embodiment of the invention is given in FIGS. 8 and 9. Now, referring to FIGS. 8 and 9, the variation of the manufacturing process will be described.

Up to the step of forming buffer coat film 8 (see FIG. 5) is substantially identical to the manufacturing process according to the first embodiment shown in FIGS. 2 and 5. Thereafter, buffer coat film 8 is heat-treated to have its state changed into its final state, and the structure as shown in FIG. 8 results. Thus, prior to forming third opening 800 (see FIG. 1), buffer coat film 8 is heat-treated to have its state changed into its final state, the mechanical strength of buffer coat film 8 and its adhesion to passivation film 7 improve, and therefore the property of the film as a mask improves.

Then, after forming patterned resist (not shown) on buffer coat film 8, anisotropic etching is performed using the patterned resist as a mask, buffer coat film 8 positioned in a region on opening 100 (see FIG. 1) is removed away, and the structure as shown in FIG. 9 results.

Thereafter, anisotropic etching is performed using buffer coat film 8 as a mask for passivation film 7 and third interconnection layers 6a and 6b as masks for first and second interlayer insulating films 3 and 5. Thus, opening 800 (see FIG. 1) can be formed by the single anisotropic etching process. Thus, the semiconductor device including the fuse layer as shown in FIG. 1 is manufactured.

Second Embodiment

Figure 11:
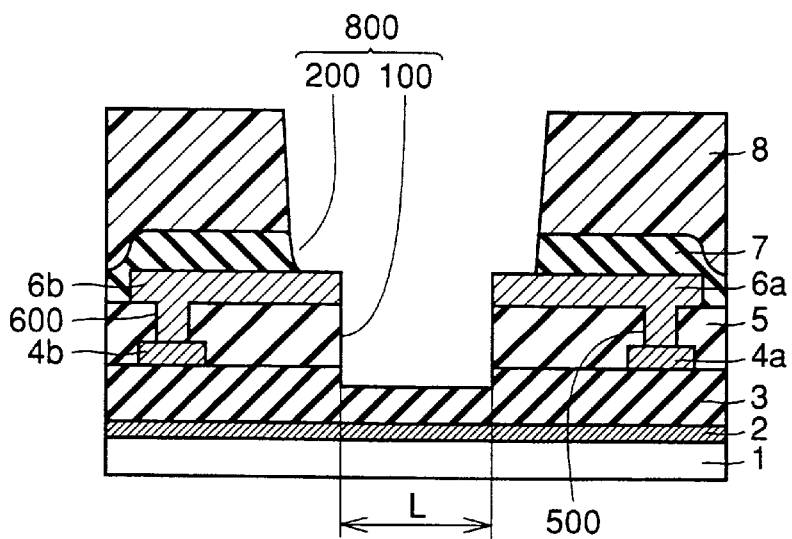
FIG. 11 is a cross sectional view showing a semiconductor device including a fuse layer according to a second embodiment of the invention.

Referring to FIG. 11, a semiconductor device including a fuse layer according to a second embodiment of the invention has a structure essentially the same as the semiconductor device including the fuse layer according to the first embodiment.

Referring to FIGS. 12 to 15, a method of manufacturing the semiconductor device according to the second embodiment will be described.

Figure 12:
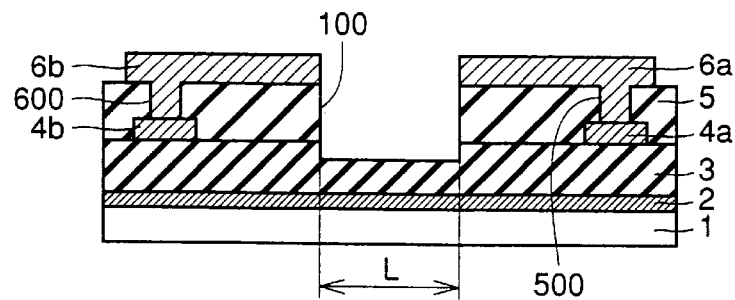
FIGS. 12 to 15 are cross sectional views for use in illustration of first to fourth steps in the manufacturing process of the semiconductor device including the fuse layer according to the second embodiment shown in FIG. 11.

Up to the step of forming third interconnection layers 6a and 6b, the method is virtually the same as the manufacturing process according to the first embodiment shown in FIGS. 2 to 4. Using third interconnection layers 6a and 6b as masks, first and second interlayer insulating films 3 and 5 are partly anisotropically etched away to form first opening 100. Thus, the structure as shown in FIG. 12 results. Herein, since third interconnection layers 6a and 6b are used as masks for forming first opening 100, patterned resist used only for forming first opening 100 is not necessary.

Figure 13:
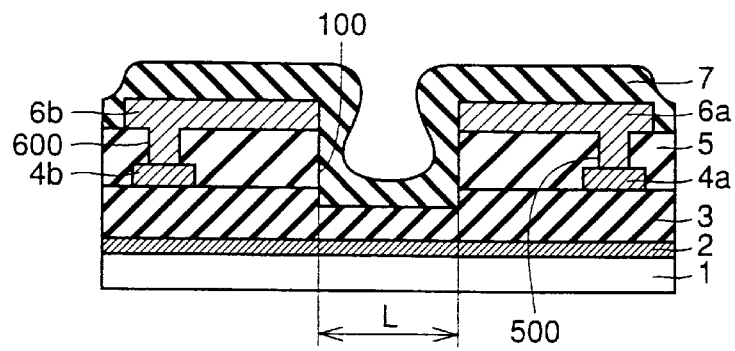
Figure 14:
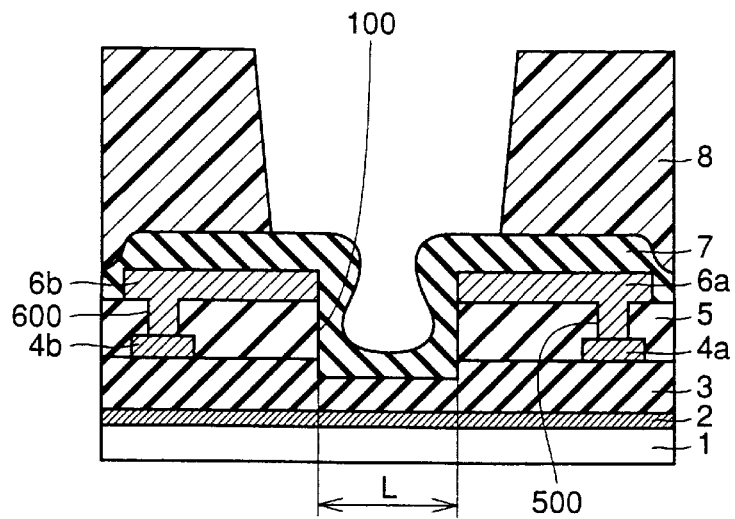

As shown in FIG. 13, passivation film 7 is formed on third interconnection layers 6a and 6b, and second interlayer insulating film 5 and in first opening 100.

Buffer coat film 8 of photosensitive polyimide resin is formed on passivation film 7. Buffer coat film 8 is exposed to light though a mask pattern, and developed to remove buffer coat film 8 positioned in the region on first opening 100 (see FIG. 13). Thus, the structure shown in FIG. 14 results.

Figure 15:
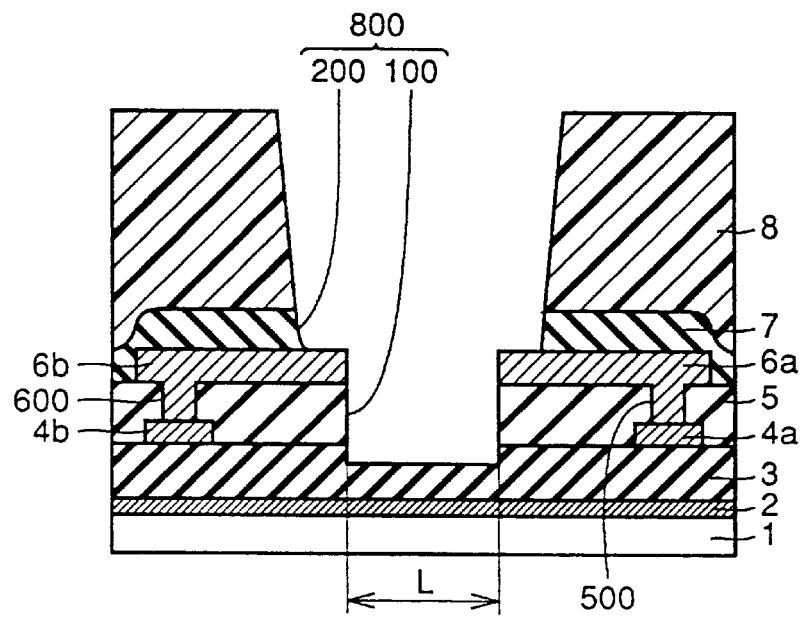
Figure 16:
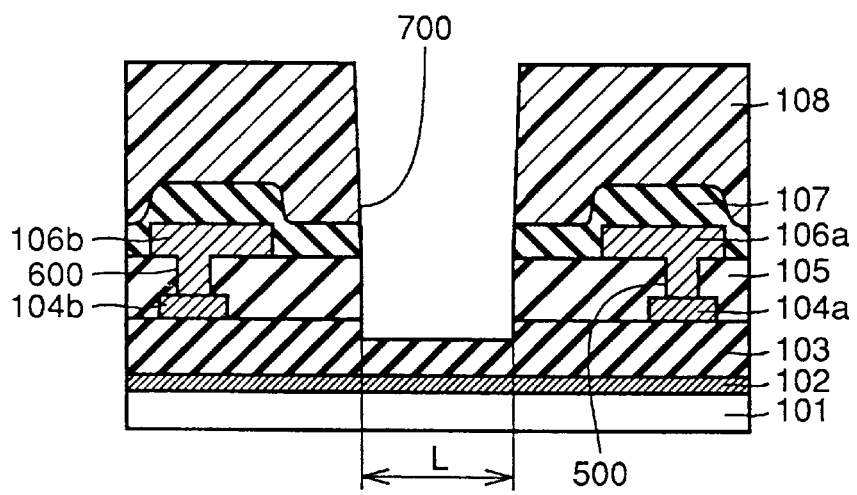
FIG. 16 is a cross sectional view showing a conventional semiconductor device including a fuse layer.
Figure 17:
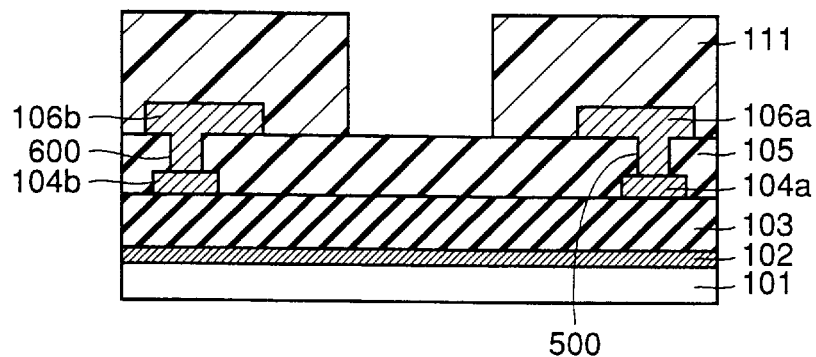
FIGS. 17 to 22 are cross sectional views for use in illustration of first to sixth steps in the manufacturing process of the conventional semiconductor device including the fuse layer shown in FIG. 16.
Figure 18:
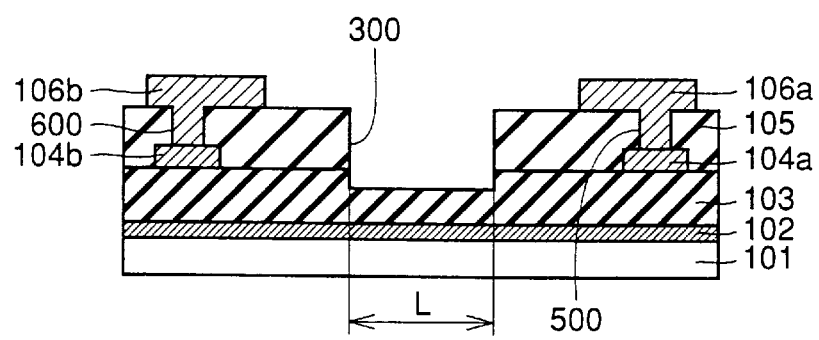
Figure 19:
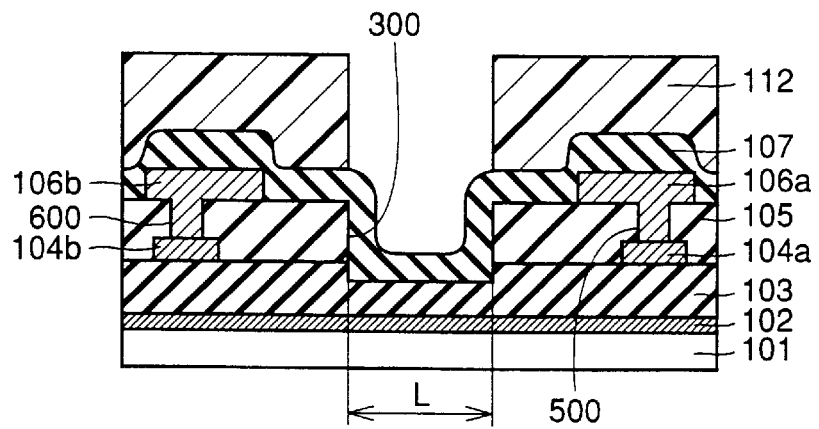
Figure 20:
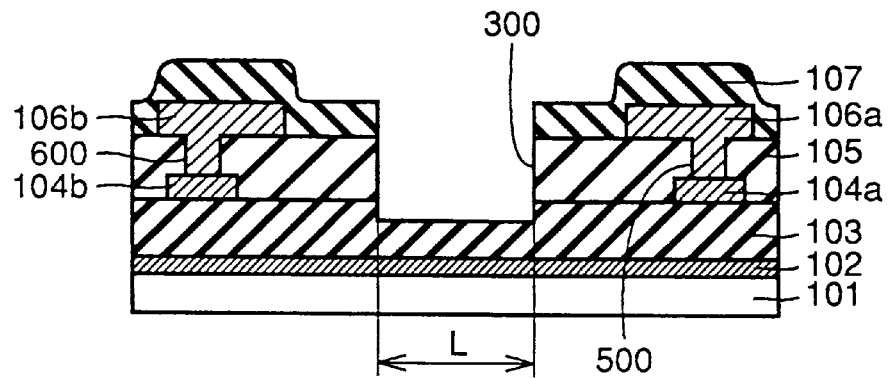
Figure 21:
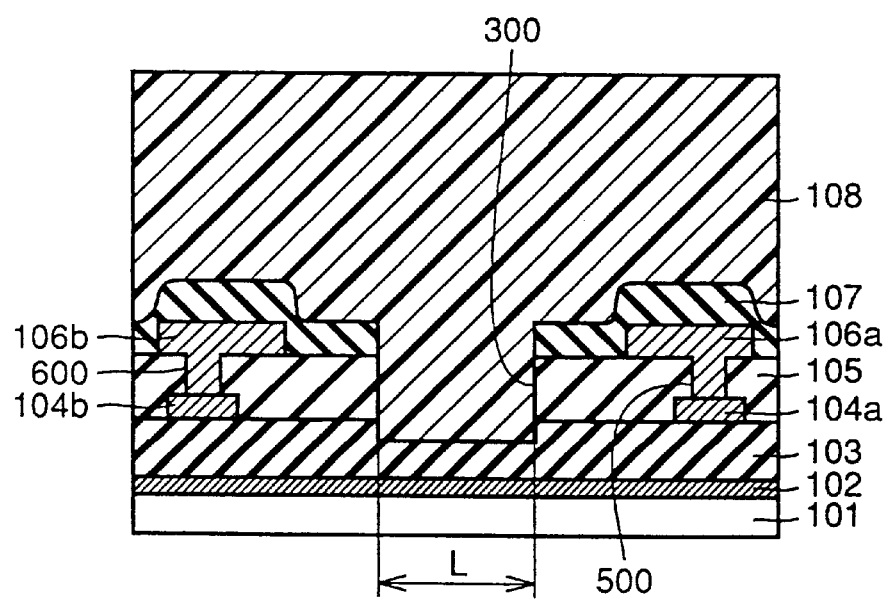
Figure 22:
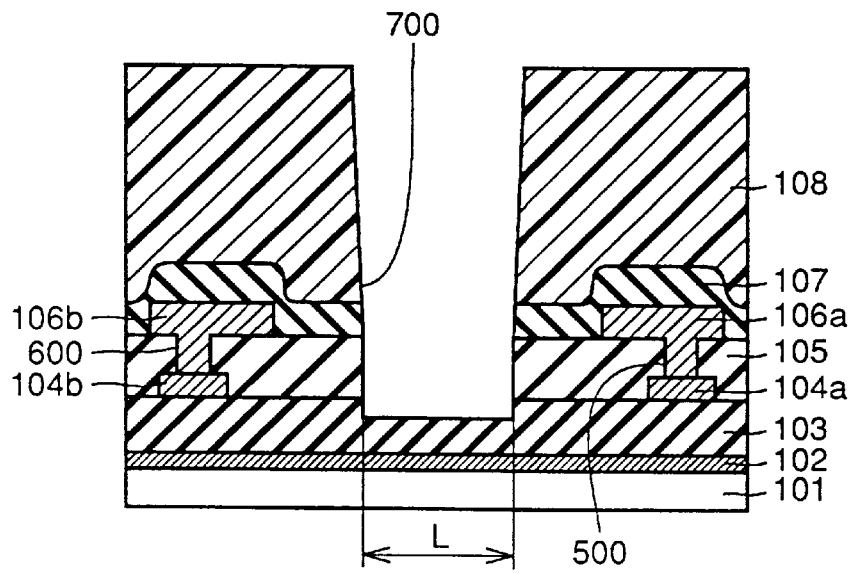
Figure 23:
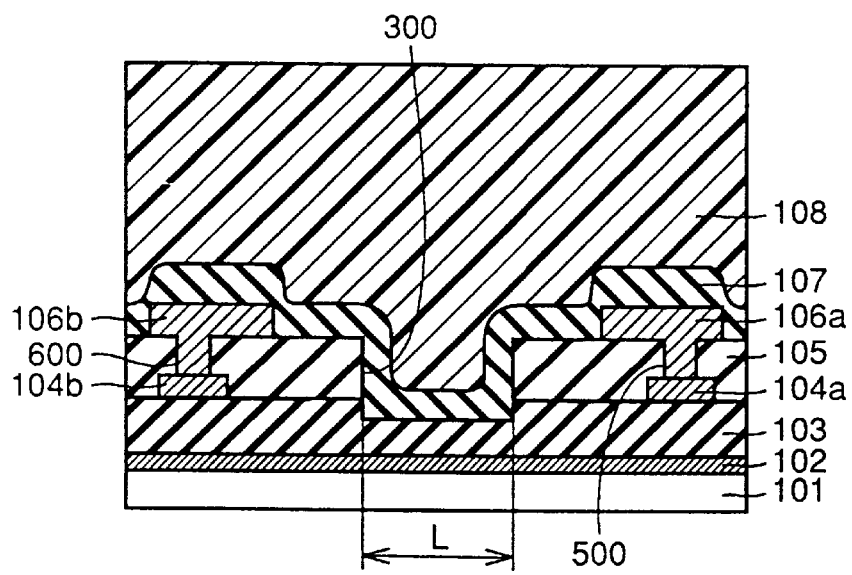
FIGS. 23 to 25 are cross sectional views for use in illustration of first to third steps in another manufacturing process of the conventional semiconductor device including the fuse layer.
Figure 24:
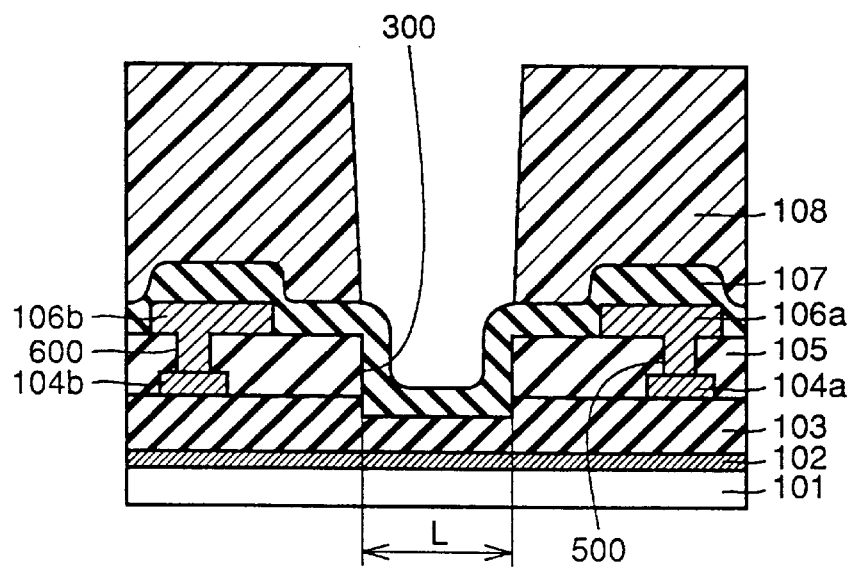
Figure 25:
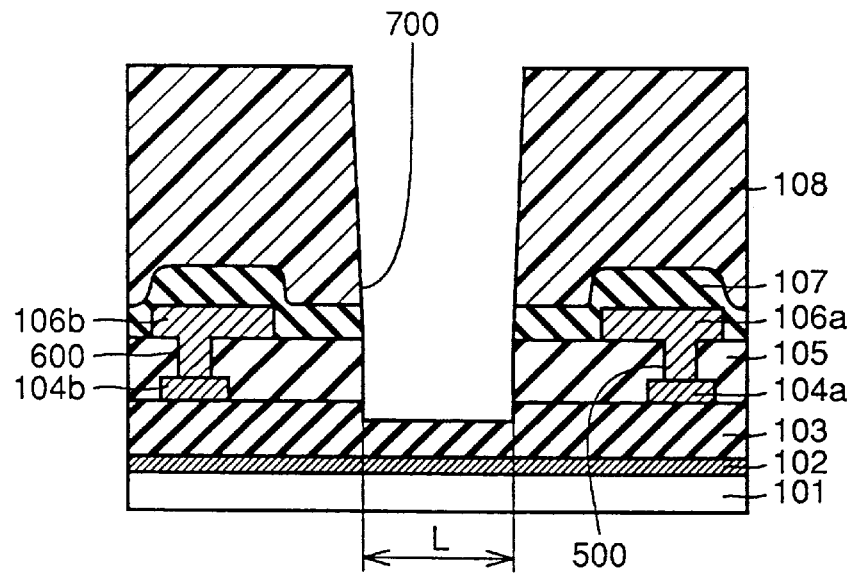
Figure 26:
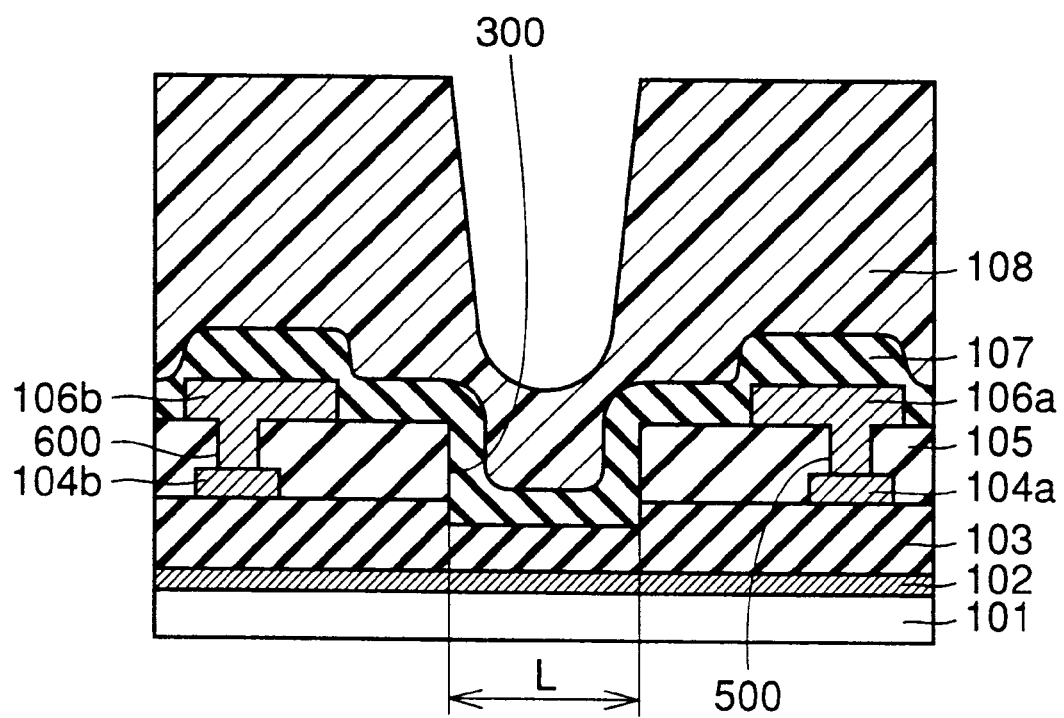
FIG. 26 is a cross sectional view showing an incomplete pattern of a buffer coat film formed in the manufacturing process shown in FIG. 24.

Then, using buffer coat film 8 as a mask, passivation film 7 positioned on third interconnection layers 6a and 6b is partly anisotropically etched away to form second opening 200. During the anisotropic etching, third interconnection layers 6a and 6b are used as masks to remove passivation film 7 positioned in first opening 100. Thus, the structure as shown in FIG. 15 results. The formation of second opening 200 and the removal of passivation film 7 positioned in first opening 100 are serially performed by the single anisotropic etching process, and therefore the number of steps included in the manufacture can be reduced.

Furthermore, third interconnections 6a and 6b are used as masks for removing passivation films 7 positioned in first opening 100, and therefore the width L of first opening 100 can be set irrespectively of the width of second opening 200. Therefore, the width of second opening 200 can be made larger than the width L of first opening 100, and the aspect ratio of third opening 800 can be reduced. As a result, during etching for removing passivation film 7 positioned in first opening 100, incomplete removal of passivation film 7 can be prevented.

Following the step shown in FIG. 15, heat-treatment is performed to change the state of buffer coat film 8 into its final state, and the structure shown in FIG. 11 results.

Note that if second interconnection layers 4a and 4b, and third interconnection layers 6a and 6b are formed as guard rings of aluminum, for example, impurities such as sodium ions or potassium ions can be prevented from entering the device at third opening 800.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device, comprising:
   a first conductive layer;
   an insulating layer formed on said first conductive layer and having a recess with a width, the width of said recess being defined by sidewalls of said insulating layer;
   a second conductive layer formed on said insulating layer and having an opening in a region positioned above said recess with a width substantially the same as that of said recess and an upper surface, the width of said opening being defined by sidewalls of said second conductive layer continuous with the sidewalls of said insulating layer; and a protection film formed on said second conductive layer and having an upper layer opening with a width larger than the width of said opening formed in the region positioned on said recess, the upper surface of said second conductive layer being exposed in said upper layer opening.

2. The semiconductor device according to claim 1, wherein said protection layer comprises:

a first protection film formed on said second conductive layer; and a second protection film formed on said first protection film.

3. The semiconductor device as recited in claim 1, wherein said first conductive layer is a fuse layer.

4. The semiconductor device as recited in claim 1, wherein said second conductive layer is a guard ring.

* * * * *